(12) United States Patent
Seidler et al.

(10) Patent No.: US 7,829,791 B2
(45) Date of Patent: Nov. 9, 2010

(54) SOLDER WIRE CONSTRUCTION

(75) Inventors: Jack Seidler, Flushing, NY (US); James R. Zanolli, North Smithfield, RI (US); Joseph S. Cachina, Warwick, RI (US)

(73) Assignee: Interplex Nas, Inc., College Point, NY (US)

(*) Notice: Subject to any disclaimer, the term of this patent is extended or adjusted under 35 U.S.C. 154(b) by 85 days.

(21) Appl. No.: 12/345,099

(22) Filed: Dec. 29, 2008

(65) Prior Publication Data

US 2009/0173517 A1    Jul. 9, 2009

Related U.S. Application Data

(60) Provisional application No. 61/018,801, filed on Jan. 3, 2008.

(51) Int. Cl.
*H01R 4/62* (2006.01)
(52) U.S. Cl. .................. 174/94 R; 174/126.1
(58) Field of Classification Search ............... 174/94 R, 174/126.1
See application file for complete search history.

(56) References Cited

U.S. PATENT DOCUMENTS

| | | | | | |
|---|---|---|---|---|---|
| 1,980,890 | A | * | 11/1934 | Tompkins | 428/385 |
| 2,132,235 | A | * | 10/1938 | Green | 174/119 C |
| 3,274,331 | A | * | 9/1966 | Quigley | 174/94 R |
| 3,333,047 | A | * | 7/1967 | Geoffroi | 174/94 R |
| 4,568,797 | A | | 2/1986 | Binder et al. | |
| 4,661,887 | A | * | 4/1987 | Lin | 361/773 |
| 4,915,286 | A | * | 4/1990 | Mentzer et al. | 228/173.5 |
| 5,184,962 | A | * | 2/1993 | Noschese | 439/66 |
| 5,281,771 | A | * | 1/1994 | Swift et al. | 174/262 |
| 6,649,843 | B2 | | 11/2003 | Aoyama et al. | |
| 2006/0263234 | A1 | | 11/2006 | Seelig | |
| 2006/0272844 | A1 | * | 12/2006 | Berghofer et al. | 174/94 R |

* cited by examiner

*Primary Examiner*—Chau N Nguyen
(74) *Attorney, Agent, or Firm*—Weingarten, Schurgin, Gagnebin & Lebovici LLP

(57) ABSTRACT

A solder construction carrier device for connecting electrical components including a carrier with a plurality of compartments and a solder construction disposed in each of the plurality of compartments. Each solder construction includes a conductive wire and a solder component disposed adjacent to the conductive wire.

18 Claims, 5 Drawing Sheets

SOLDER WIRE CONSTRUCTION

This application claims priority to U.S. Provisional Application No. 61/018,801, filed Jan. 3, 2008, the entire contents of which are hereby incorporated by reference.

TECHNICAL FIELD

The present invention relates to the field of components for joining connectors or other electrical components to one another and, more particularly, to a solder wire construction for facilitating the soldering of first electronic devices, such as connectors, to second electronic devices, such as printed circuit boards.

BACKGROUND

It is often necessary and desirable to electrically connect one component to another component. For example, a multi-terminal component, such as a connector, is often electrically connected to a substrate, such as a printed circuit board, so that the terminals of the component are securely attached to contact pads formed on the substrate to provide an electrical connection therebetween. One preferred technique for securely attaching the component terminals to the contact pads is to use a solder material around a particular area, such as a hole, which typically receives one component terminal. As is know, a solder is a fusible metal alloy with a melting point or melting range of about 180 to 190° C. used in a soldering process where it is melted to join metallic surfaces.

Solder often comes pre-mixed with, or is used with, flux, a reducing agent designed to help remove impurities (specifically oxidised metals) from the points of contact to improve the electrical connection. For convenience, solder is often manufactured as a hollow tube and filled with flux. Most cold solder is soft enough to be rolled and packaged as a coil, making for a convenient and compact solder/flux package.

In a typical application, the solder material, e.g., solder paste, is generally applied around each contact hole and then heated after the conductive pin is received within and extends through the contact hole. The heating of the solder paste causes the solder paste to flow around the conductive pin and the contact hole. The cooling of the solder paste results in the conductive pin being securely attached to one of the contact pads formed on the substrate.

While the use of solder paste is effective in some applications, there are a number of applications in which an improved solder construction is needed or desired due to the orientation of the solder, etc., in the application.

It is therefore desirable to provide an alternative solder construction.

SUMMARY

According to one embodiment, a solder construction includes a conductive wire and solder disposed around the conductive wire so as to encapsulate the conductive wire. The solder is formed to have a predefined shape, such as a cylindrical shape.

A solder construction includes an elongated first component formed of a non-reflowable material and an elongated second component at least including a solder material. The elongated first and second components are twisted (stranded) with respect to one another over lengths thereof.

According to another embodiment, a solder construction includes an elongated first component that is formed of at least a solder material and a plurality of elongated second components that surround and are spaced about the periphery of the elongated first component. Each of the second components is formed of a non-reflowable material. The elongated second components are coupled to the first component so that the first component is the innermost member.

A solder construction includes an elongated first component that is formed of a non-reflowable material and a plurality of elongated second components that surround and are spaced about the periphery of the elongated first component. Each of the second components includes at least a solder material and the elongated second components are coupled to the first component so that the first component is the innermost member.

In yet another embodiment, a solder construction includes an elongated first component that is formed of a non-reflowable material. The first component has a first coupling feature formed along a first surface thereof. The solder construction also includes an elongated second component that is formed of at least a solder material and includes a second coupled feature formed along a second surface thereof. The first and second coupling features mate with one another to couple the first and second components to one another.

In yet another embodiment, a solder construction includes an elongated second component that is formed of at least a solder material and has a curved body with two ends thereof being spaced from one another by a gap that forms an entrance into a cavity. The solder construction includes an elongated first component that is formed of a non-reflowable material. The first component is wedged or folded in the cavity defined by the second component.

BRIEF DESCRIPTION OF THE DRAWINGS

Objects and features of the present invention will be described hereinafter in detail by way of certain preferred embodiments with reference to the accompanying drawings, in which.

DETAILED DESCRIPTION OF VARIOUS EMBODIMENTS

Figure 1:
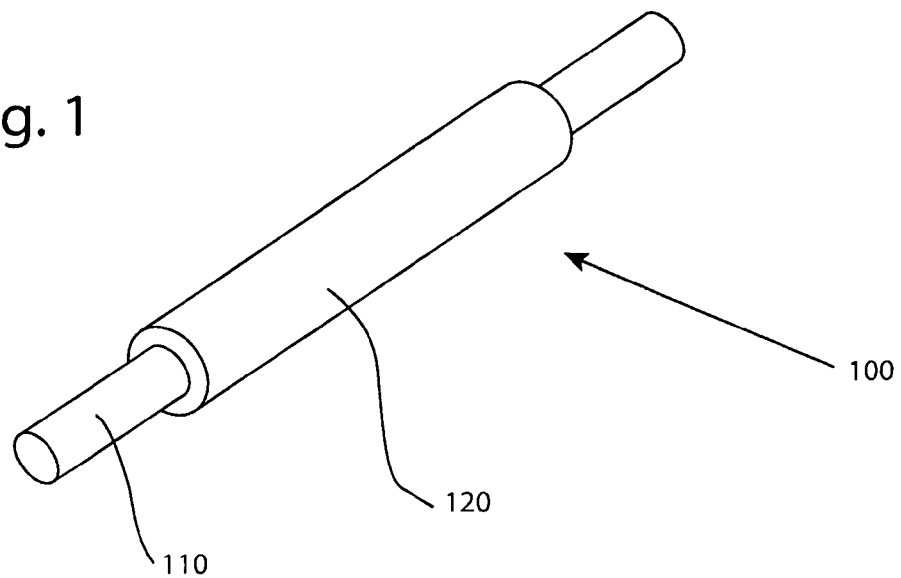
FIG. 1 is a perspective view of a solder construction according to a first embodiment.

FIG. 1 is a perspective view of a solder construction 100 according to a first embodiment. The solder construction 100 is of a bi-layer construction in that the solder construction 100 includes an inner wire 110 (inner part) and a mass of solder 120 that surrounds the inner wire 110 and represents the outer part.

The inner wire 110 is in the form of an elongated wire that is formed of a conductive material, such as copper. The mass of solder 120 is formed around the inner wire 110 such that it surrounds the inner wire 110. The solder 120 can have any number of different shapes and dimensions. For example, the illustrated solder mass 120 is in the form of a cylinder (however, other shapes, such as an oval, square, triangle, etc., are possible). In this bi-layer construction, the inner wire 110 is the inner part and the solder mass 120 is the outer part. The inner wire 110 thus represents a backbone or extra support structure of the solder construction 100. This extra robustness is helpful in a number of different applications including those described herein.

Figure 2:
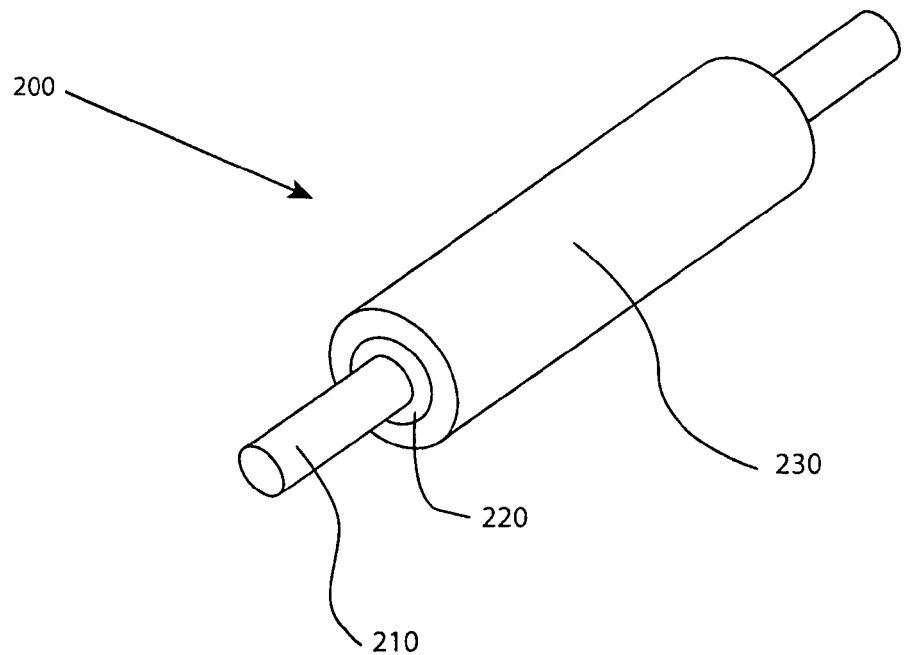
FIG. 2 is a perspective view of a solder construction according to a second embodiment.

FIG. 2 is a perspective view of a solder construction 200 according to a second embodiment. The solder construction 200 is of a tri-layer construction in that the solder construction 200 includes an inner wire 210 (inner part), a mass of flux material 220 (middle or central part) that surrounds the inner wire 210, and a mass of solder 230 that surrounds the flux material 220 and represents the outer part.

The inner wire 210, like inner wire 110, is in the form of an elongated wire that is formed of a conductive material, such as copper. The mass of flux 220 is formed around the inner wire 210 such that it surrounds the inner wire 210. The flux 220 can have any number of different shapes and dimensions. For example, the illustrated mass of flux material 220 is in the form of a cylinder. The mass of solder material 230 is formed around the mass of flux 220 such that the solder material 230 is the outermost layer of material. The solder material 230 can have any number of different shapes and dimensions. For example and as shown in FIG. 2, the solder material 230 has an annular shape with the cylindrically-shaped flux material 220 being formed in the opening defined by the solder material 230.

It will be appreciated that the inner wire 210, flux 220 and solder material 230 are concentric with respect to one another in the illustrated embodiment.

Figure 3:
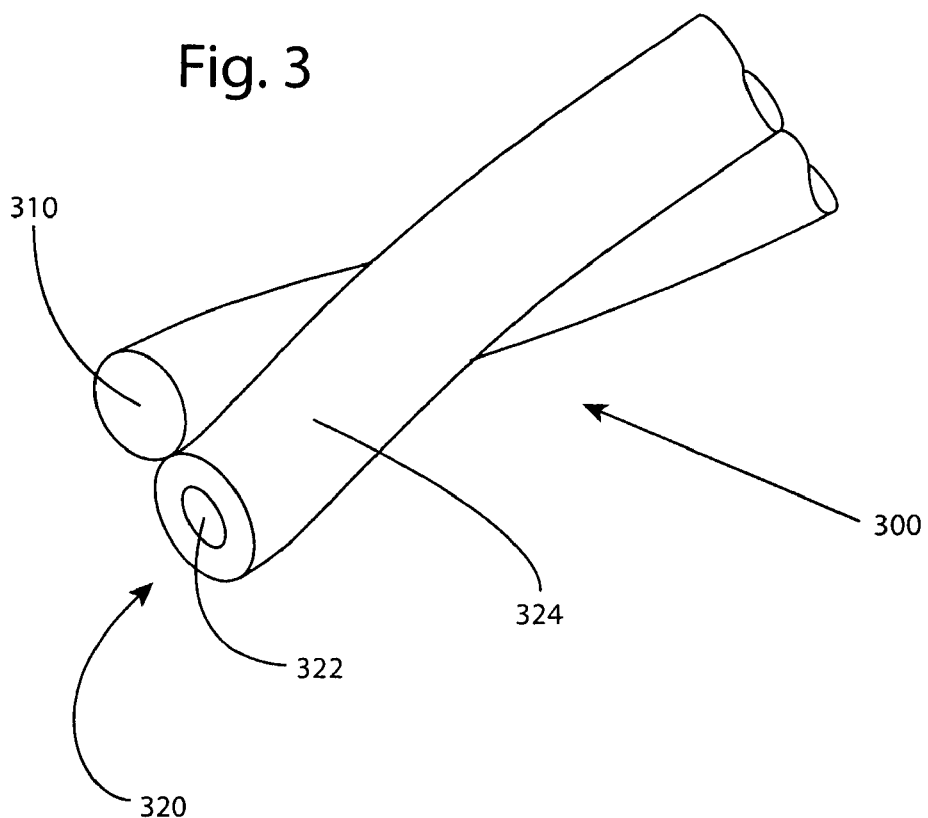
FIG. 3 is a perspective view of a solder construction according to a third embodiment.

FIG. 3 is a perspective view of a solder construction 300 according to a third embodiment. The solder construction 300 is of a stranded or twisted construction in that the solder construction 300 includes a first component 310 and a second component 320 that are stranded or twisted with respect to one another. The first component 310 is an elongated member that is not intended to reflow during the heating operation, while the second component 320 is in the form of an elongated member that is intended to reflow during the heating operation. For example, the first component 310 can be in the form of a conductive wire (e.g., copper wire) or it can be formed of a high temperature material, such as high temperature solder, etc., that is not intended to reflow. The second component 320 is at least partially formed of a reflowable material, such as solder, that reflows during the heating operation. For example, the second component 320 can be, as illustrated, formed of a flux cored solder wire that is defined by an inner flux section 322 and an outermost layer of solder material 324. The flux section 322 can be an elongated wire-like structure of flux material, while the solder material 324 surrounds the flux 322 and can have any number of different shapes and dimensions, including a cylindrical shape (as shown). It will also be appreciated that the second component 320 can be simply a solid solder wire.

As mentioned above, the solder construction 300 is a stranded or twisted structure and therefore, the elongated first and second components 310, 320 are stranded/twisted with respect to one another as shown to form a single structure.

Figure 4:
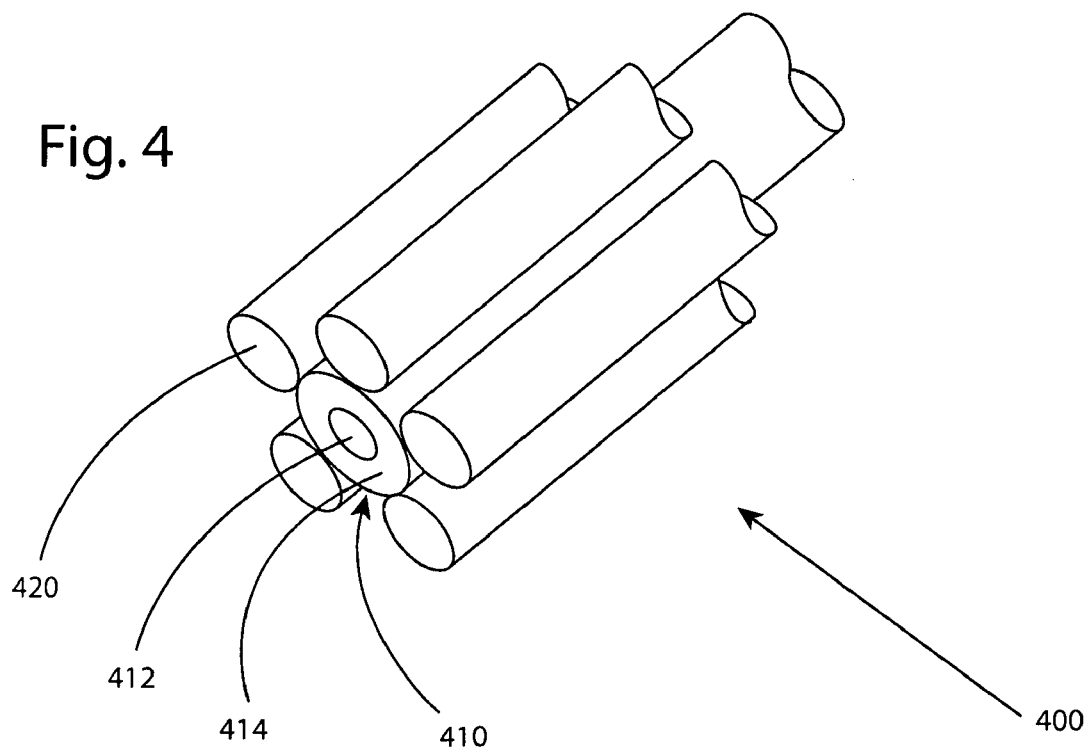
FIG. 4 is a perspective view of a solder construction according to a fourth embodiment.

FIG. 4 is a perspective view of a solder construction 400 according to a fourth embodiment. The solder construction 400 is of a multi-strand or fused construction in that the solder construction 400 includes a center component 410 and a plurality of outer components 420 that are stranded or fused with respect to the center component 410. The center component 410 is an elongated member that is intended to reflow during the heating operation, while the outer components 420 are in the form of elongated members that are not intended to reflow during the heating operation. For example, the outer components 420 can be in the form of conductive wires (e.g., copper wires) or each can be formed of a high temperature material, such as high temperature solder, etc., that is not intended to reflow. The center component 410 is at least partially formed of a reflowable material, such as solder, that reflows during the heating operation. For example, the center component 410 can be, as illustrated, formed of a flux cored solder wire that is defined by an inner flux section 412 and an outermost layer of solder material 414. The flux section 412 can be an elongated wire-like structure of flux material, while the solder material 414 surrounds the flux 412 and can have any number of different shapes and dimensions, including a cylindrical shape (as shown). The center component 410 does not have to have the flux section 412 but instead, the center component 410 can be formed of only solid solder.

In the illustrated embodiment, there are five outer components 420 in the form of conductive wires that surround and are spaced circumferentially around the center component 410. The outer components 420 can be evenly spaced about the circumference of the center component 410 or they can be unevenly spaced thereabout. It will be appreciated that the outer components 420 can be fused to the center component 410 and/or the outer components 420 can be twisted around the center component 410. It will be appreciated that in this embodiment, only the center component 410 is designed to reflow during a typical heating (solder) operation.

Figure 5:
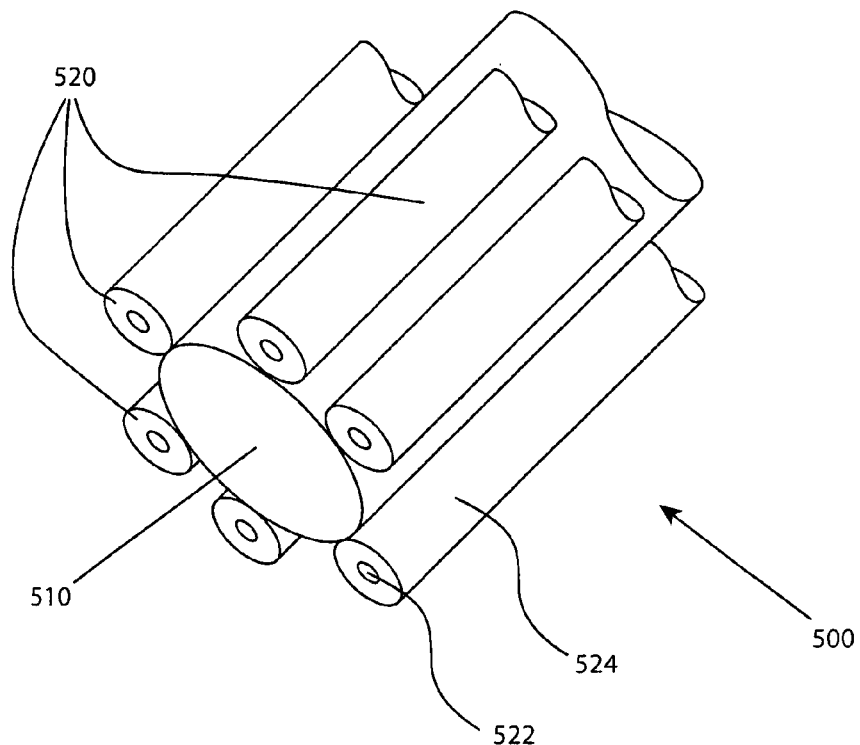
FIG. 5 is a perspective view of a solder construction according to a fifth embodiment.

FIG. 5 is a perspective view of a solder construction 500 according to a fifth embodiment. The solder construction 500 is similar to the solder construction 400 in that it has a multi-strand construction. The solder construction 500 includes a center component 510 and a plurality of outer components 520 that are stranded or fused with respect to the center component 510. The center component 510 is an elongated member that is not intended to reflow during the heating operation, while the outer components 520 are in the form of elongated members that are intended to reflow during the heating operation. For example, the center component 510 can be in the form of a conductive wire (e.g., copper wire) or it can be formed of a high temperature material, such as high temperature solder, etc., that is not intended to reflow. Each of the outer components 520 is at least partially formed of a reflowable material, such as solder, that reflows during the heating operation. For example, each of the outer components 520 can be, as illustrated, formed of a flux cored solder wire that is defined by an inner flux section 522 and an outermost layer of solder material 524. The flux section 522 can be an elongated wire-like structure of flux material, while the solder material 524 surrounds the flux 522 and can have any number of different shapes and dimensions, including a cylindrical shape (as shown). The outer component 520 does not have to have the flux section 522 but instead, the outer component 520 can be formed of only solid solder.

In the illustrated embodiment, there are five outer components 520 in the form of solder wires that surround and are spaced circumferentially around the center component 510. The outer components 520 can be evenly spaced about the circumference of the center component 510 or they can be unevenly spaced thereabout. It will be appreciated that the outer components 520 can be fused to the center component 510 and/or the outer components 520 can be twisted around the center component 510. It will be appreciated that in this embodiment, only the outer components 520 are designed to reflow during a typical heating (solder) operation. In this embodiment, the non-reflow center component 510 provides a structure that supports the outer components 520 and adds robustness, etc. to the overall design of the construction 500.

Figure 6:
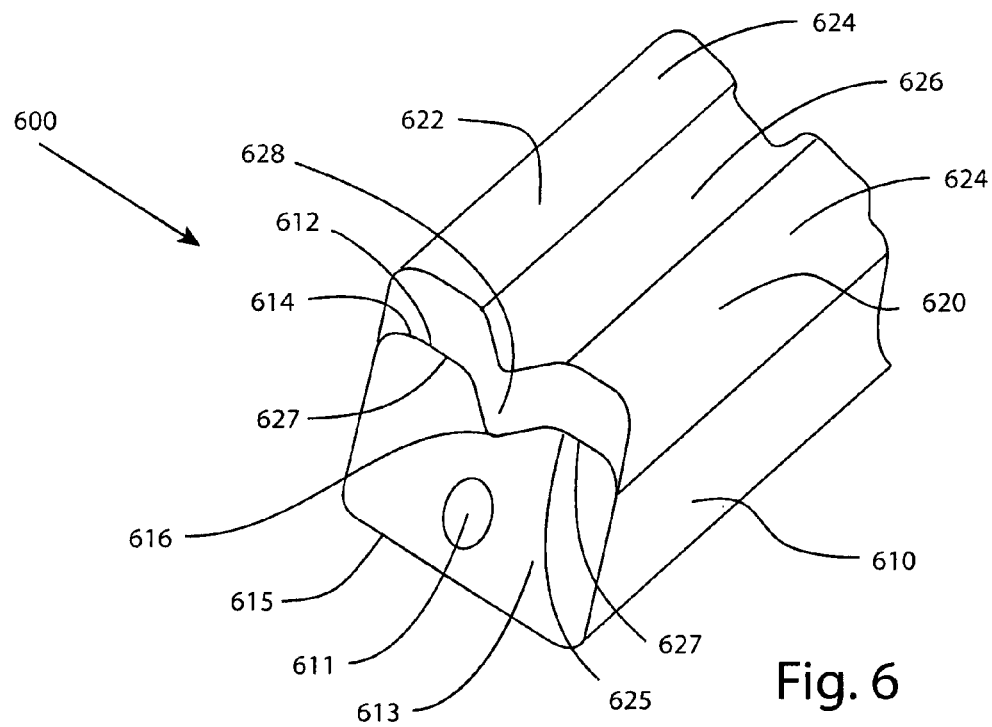
FIG. 6 is a perspective view of a solder construction according to a sixth embodiment.

FIG. 6 illustrates a solder construction 600 according to a sixth embodiment of the present invention. The solder construction 600 has a ribbon construction in that it is formed of a first component 610 and a second component 620 that is disposed over the first component 610 to form a layered construction.

The first component 610 is an elongated member that is intended to reflow during the heating operation, while the overlying second component 620 is in the form of elongated members that are not intended to reflow during the heating operation. For example, the second component 620 can be in the form of a conductive wire/ribbon or it can be formed of a high temperature material, such as high temperature solder, etc., that is not intended to reflow. In this embodiment, the second component 620 has a ribbon shape in that it includes a first surface or face 622 and an opposing second surface or face 625. The first surface 622 is an undulating surface in that it has two raised portions 624 with a valley 626 therebetween. The raised portions 624 can have smooth arcuate surfaces (e.g., semi-circular). In other words, the raised portions 624 can be convex surfaces. The second surface 625 preferably is complementary to the first surface 622 in that it includes a pair of recessed portions 627 with a protrusion 628 therebetween. The recessed portions 627 can have a concave shape and the protrusion 628 can have a convex surface. The recessed portions 627 are located beneath the raised portions 624, while the protrusion 628 is located beneath the valley 626.

The first component 610 is an elongated member that is intended to reflow during the heating operation and can be in the form of a solder wire/ribbon that is intended to reflow. In this embodiment, the first component 610 has a ribbon shape in that it includes a first surface or face 612 and an opposing second surface or face 615. The first surface 612 is a nonplanar surface in that it has two raised portions 614 with a valley 616 therebetween. The raised portions 614 can have smooth arcuate surfaces (e.g., semi-circular). In other words, the raised surfaces 614 can have smooth arcuate surfaces (e.g., semi-circular), and can be convex surfaces. The first surface 612 is complementary to the second surface 625 of the second component 620. When the first and second components 610, 620 are mated with one another, the protrusion 628 is received within the valley 616 and the raised portions 614 are received within the recessed portions 627 of the second component 620. The second surface 615 can be a planar surface (as shown) or it can be an irregular surface, such as an undulating surface.

It will also be appreciated that the first and second components 610, 620 can be reversed in that the second component 620 can be the component that includes the reflow material (solder) and the first component 610 can be the component that includes the non-reflow material.

The first component 610 is at least partially formed of a reflowable material, such as solder, that reflows during the heating operation. For example, the first component 610 can be, as illustrated, formed of a flux cored solder ribbon that is defined by an inner flux section 611 and an outermost layer of solder material 613. The flux section 611 can be an elongated wire-like structure of flux material, while the solder material 613 surrounds the flux 611 and can have any number of different shapes and dimensions, including the illustrated ribbon structure.

Figure 7:
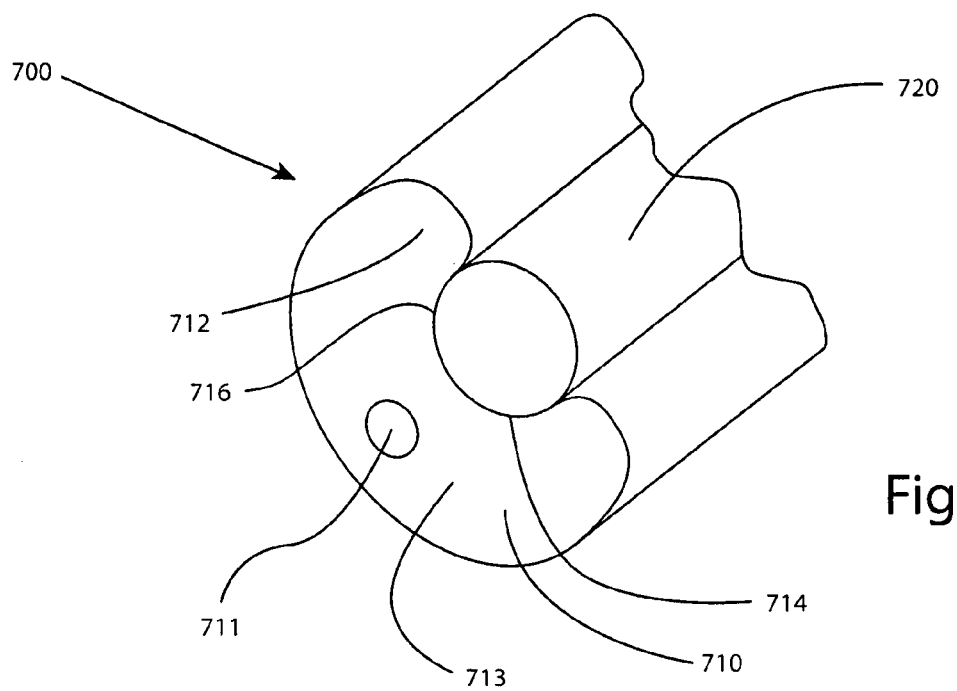
FIG. 7 is a perspective view of a solder construction according to a seventh embodiment.

FIG. 7 illustrates a solder construction 700 according to a seventh embodiment of the present invention. The solder construction 700 has a ribbon construction in that it is formed of a first component 710 and a second component 720.

The first component 710 is an elongated member that is intended to reflow during a heating operation, while the second component 720 is not intended to reflow during the heating operation. The first component 710 has, in the illustrated embodiment, a kidney shape or a C-shape in that its curved body has two ends 712 that face but are spaced from one another so as to form a channel or gap 714 between the two ends 712. An outer surface 716 of the body between the two ends 712 has an arcuate (curved) shape.

The first component 710 is at least partially formed of a reflowable material, such as solder, that reflows during the heating operation. For example, the first component 710 can be, as illustrated, formed of a flux cored solder structure that is defined by an inner flux section 711 and an outermost layer of solder material 713. The flux section 711 can be an elongated wire-like structure of flux material, while the solder material 713 surrounds the flux 711 and can have any number of different shapes and dimensions, including the illustrated kidney or C-shaped structure.

The second component 720 is not intended to reflow during the heating operation. For example, the second component 720 can be in the form of a conductive wire (e.g., copper wire) or can be formed of a high temperature material, such as high temperature solder, etc., that is not intended to reflow. The second component 720 is disposed between the two ends 712 and into contact with the outer surface 716 of the body. For example, the second component 720 can be wedged or folded in the first component 710 and in particular, within the space between the ends 712 and into contact with the outer surface 716. This action results in the second component 720 being securely cradled or nested within the first component 710.

The first component 710 is thus designed to cradle the second component 720 such that the second component 720 nests within the first component 710 and in particular, the second component 720 seats against the outer surface 716 between the two end 712.

The solder constructions disclosed herein can be manufactured using any number of different techniques, including but not limited to using an extrusion process.

Figure 8:
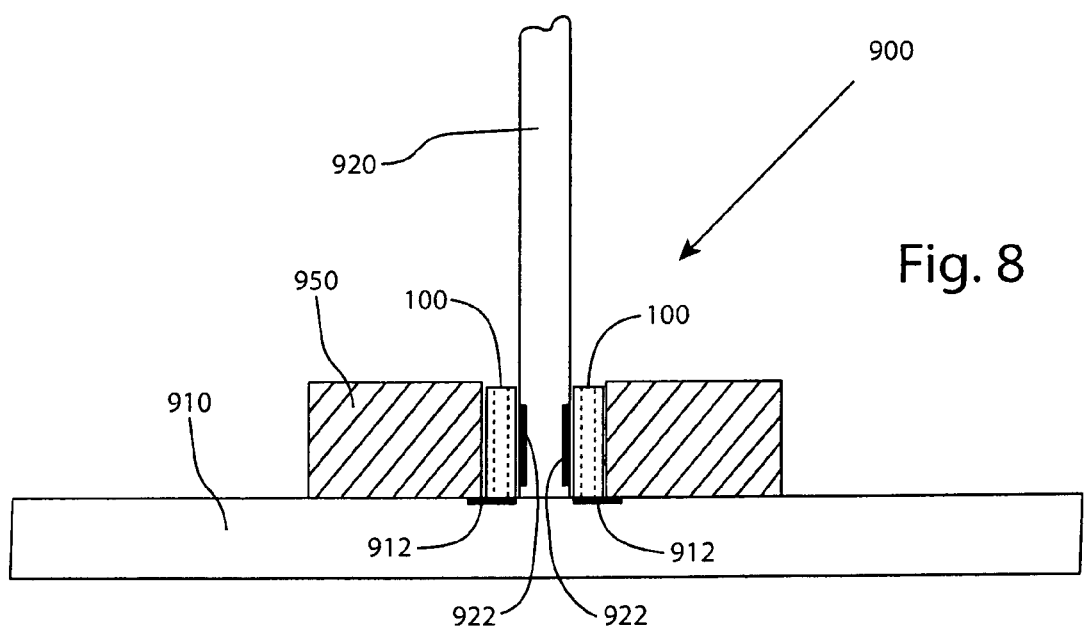
FIG. 8 illustrates the solder construction being used in a perpendicular mount device or assembly.

The solder constructions described herein can be used in any number of applications where solder is used to attach one device to another device. For example, FIG. 8 shows the solder construction being used in a perpendicular mount device or assembly 900. The assembly 900 includes a first component or device 910 and a second component or device 920 that are to be electrically attached to one another. The first component 910 includes one or more contacts 912 (e.g., conductive pads) and the second component 920 includes one or more contacts 922 (e.g., conductive pads). To electrically connect the first and second components 910, 920, an electrical connection is made between the contacts 912 and the contacts 922. The assembly 900 is a perpendicular mount assembly since the first and second components 910, 920 are oriented perpendicular to one another. For example, the first component 910 can be a printed circuit board (PCB) that is horizontally oriented and the second component 920 can be a printed circuit board (PCB) that is vertically oriented. The solder constructions of the present invention are vertically oriented in a wafer or carrier 950 that is designed to mate with and properly position the solder constructions relative to the first and second components 910, 920. For purposes of illustration only, the solder construction illustrated in FIG. 8 is indicated as being solder construction 100 (FIG. 1); however, it will be understood that any of the solder constructions of FIGS. 2-7 can be used with the assembly 900.

The carrier 950 thus includes a plurality of spaces or compartments in which a segment of the solder construction 100 is vertically disposed. The carrier 950 is positioned so that the solder construction 100 faces the vertically oriented contact pad 922 of the vertical component 920 and similarly, the solder construction 100 is disposed over the contact pad 912 of the horizontal component 910. Upon reflow, the solder construction 100 flows both onto the vertical contact pad 922 of the vertical component (PCB) 920, as well as onto the horizontal pad 912 of the horizontal component (PCB) 910. After cooling, the reflowed solder construction thus electrically connects the contact pad 922 to the contact pad 912, thereby establishing an electrical connection between the two components 910, 920.

It will be appreciated that the first component likely includes a plurality of contact pads 912 that can be arranged linearly along a portion of the horizontal component 910. Similarly, the second component likely includes a plurality of contact pads 922 that can be arranged linearly along a bottom edge of the vertical component 920. The carrier 950 is designed to include a number of compartments or spaces for receiving and vertically holding the solder segments 100 in such a way that each solder segment 100 is positioned in the above-described position relative to the contacts 912, 922.

Figure 9:
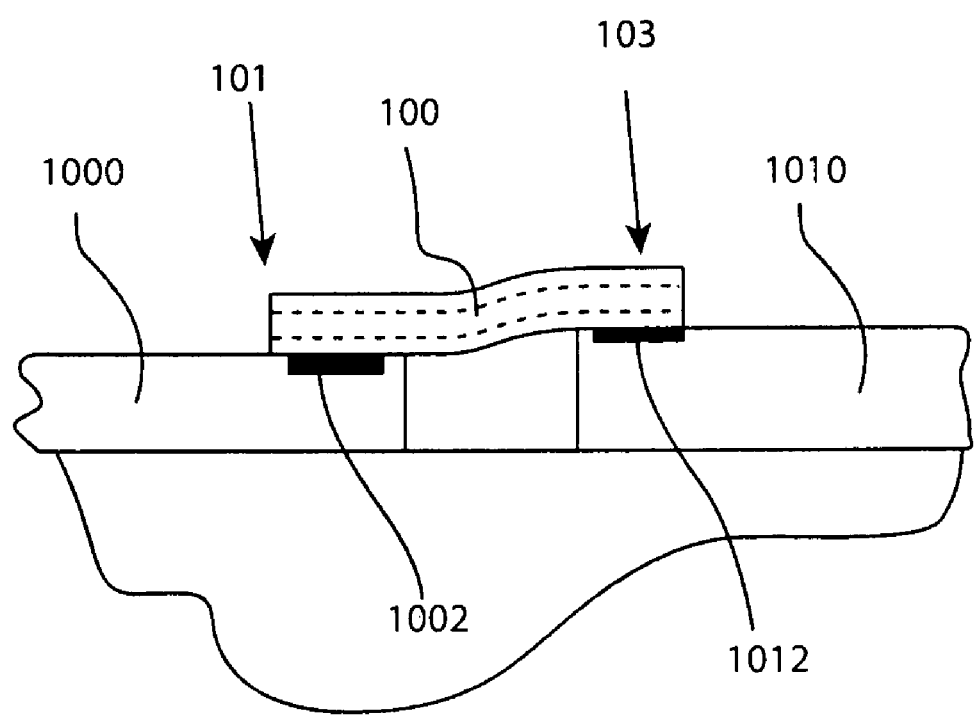
FIG. 9 illustrates the solder construction being used to electrically connect one component to another component.

FIG. 9 shows one of the solder constructions of the present invention being used to join a first electronic device 1000 to a second electronic device 1010. In this application, the solder construction 100 is used similar to wire bonding in that it electrically connects a first conductive portion (contact) 1002 of the first electronic device 1000 to a second conductive portion (contact) 1012 of the second electronic device 1010. In particular, a first end 101 of the solder construction 100 is positioned on or proximate the contact 1002, while the opposite second end 103 of the solder construction 100 is positioned on or proximate the contact 1012. The reinforcement of the solder construction 100 by the inner wire permits the solder construction 100 to be bent or otherwise positioned so that the solder construction 100 extends between the two electronic devices 1000, 1010. For example, FIG. 9 shows the contacts 1002, 1012 being non-planar relative to one another and therefore, the solder construction 100 is bent upwardly to permit the second end 103 to be positioned in a high plane than the first end 101. Of course, it will be appreciated that any of the solder constructions disclosed herein can be manipulated to extend between the two contacts 1002, 1012. For example, the solder construction can be bent or twisted in different ways similar to wire bonding to produce an electrical connection between the two devices 1000, 1010.

Although preferred embodiments have been disclosed for illustrative purposes, those skilled in the art will appreciate that many additions, modifications and substitutions are possible without departing from the scope and spirit of the invention.

We claim:

1. A device for electrically connecting first and second electrical components each component having at least one electrical contact, the device comprising:
    a carrier for receiving the first and second electrical components, the carrier having a plurality of compartments;
    at least one of the compartments being adjacent to the at least one contact of the first electrical component when received in the carrier;
    at least one of the compartments being adjacent to the at least one contact of the second electrical component when received in the carrier;
    a plurality of solder constructions, each disposed in a respective one of the compartments in the carrier for engagement with a confronting contact of respective electrical components and electrical connection to the electrical components received in the carrier;
    each of the solder constructions having a conductive wire and a solder component adjacent the conductive wire, such that upon reflow of the solder constructions, the at least one contact of the first electrical component is electrically connected to the at least one contact of the second electrical component,
wherein the solder construction includes a plurality of solder components in the form of solder wires disposed around a circumference of the conductive wire.

2. A device for electrically connecting first and second electrical components each component having at least one electrical contact, the device comprising:
    a carrier for receiving the first and second electrical components, the carrier having a plurality of compartments and structured and arranged to receive the first and second electrical components in one of an orthogonal orientation or in a side-by-side orientation;
    at least one of the compartments being adjacent to the at least one contact of the first electrical component when received in the carrier;
    at least one of the compartments being adjacent to the at least one contact of the second electrical component when received in the carrier;
    a plurality of solder constructions, each disposed in a respective one of the compartments in the carrier for engagement with a confronting contact of respective electrical components and electrical connection to the electrical components received in the carrier;
    each of the solder constructions having a conductive wire and a solder component adjacent the conductive wire, such that upon reflow of the solder constructions, the at least one contact of the first electrical component is electrically connected to the at least one contact of the second electrical component.

3. The device of claim 2, wherein the solder component includes solder material disposed around a circumference of the conductive wire.

4. The device of claim 3, wherein the solder component includes flux material annularly disposed around a circumference of the conductive wire and solder material annularly disposed around the flux material.

5. The device of claim 2, wherein the solder component includes a solder wire disposed adjacent the conductive wire.

6. The device of claim 5, wherein the solder wire includes flux material surrounded by solder material.

7. The device of claim 2, wherein the solder construction includes a plurality of conductive wires disposed around a circumference of the solder component, and wherein the solder component includes a solder wire.

8. The device of claim 7, wherein the solder wire includes flux material surrounded by solder material.

9. The device of claim 2, wherein the conductive wire is in the form of a conductive ribbon.

10. The device of claim 9, wherein the conductive ribbon includes a first undulating surface and the solder component includes a second undulating surface corresponding to the first undulating surface.

11. The device of claim 2 in which the solder construction includes a conductive wire of non-reflowable material.

12. The device of claim 2 in which the first and second electrical components are each a circuit board.

13. The device of claim 2 wherein the solder component of the solder construction includes a flux material disposed therein.

14. The device of claim 2 wherein each of the solder constructions has a first contact area positioned to engage a confronting contact of the first electrical component and a second contact area positioned to engage the confronting contact of the second electrical component.

15. The device of claim 2 wherein the first and second electrical components are printed circuit boards.

16. A device for electrically connecting first and second electrical components each component having at least one electrical contact, the device comprising:
   a carrier for receiving the first and second electrical components, the carrier having a plurality of compartments;
   at least one of the compartments being adjacent to the at least one contact of the first electrical component when received in the carrier;
   at least one of the compartments being adjacent to the at least one contact of the second electrical component when received in the carrier;
   a plurality of solder constructions, each disposed in a respective one of the compartments in the carrier for engagement with a confronting contact of respective electrical components and electrical connection to the electrical components received in the carrier;
   each of the solder constructions having a conductive wire and a solder component adjacent the conductive wire, such that upon reflow of the solder constructions, the at least one contact of the first electrical component is electrically connected to the at least one contact of the second electrical component,
   wherein the solder construction includes:
      a conductive wire of non-reflowable material and having an arcuate outer surface;
      a solder component of generally C-shape and having a curved face partially surrounding the outer surface of the conductive wire.

17. A device for electrically connecting first and second electrical components each component having at least one electrical contact, the device comprising:
   a carrier for receiving the first and second electrical components, the carrier having a plurality of compartments;
   at least one of the compartments being adjacent to the at least one contact of the first electrical component when received in the carrier;
   at least one of the compartments being adjacent to the at least one contact of the second electrical component when received in the carrier;
   a plurality of solder constructions, each disposed in a respective one of the compartments in the carrier for engagement with a confronting contact of respective electrical components and electrical connection to the electrical components received in the carrier;
   each of the solder constructions having a conductive wire and a solder component adjacent the conductive wire, such that upon reflow of the solder constructions, the at least one contact of the first electrical component is electrically connected to the at least one contact of the second electrical component,
   wherein the solder construction includes:
      a solder component of generally C-shape and having two spaced ends and a curved channel therebetween;
      the conductive wire being retained in the curved channel of the solder component.

18. A device for electrically connecting first and second electrical components each component having at least one electrical contact, the device comprising:
   a carrier for receiving the first and second electrical components, the carrier having a plurality of compartments;
   at least one of the compartments being adjacent to the at least one contact of the first electrical component when received in the carrier;
   at least one of the compartments being adjacent to the at least one contact of the second electrical component when received in the carrier;
   a plurality of solder constructions, each disposed in a respective one of the compartments in the carrier for engagement with a confronting contact of respective electrical components and electrical connection to the electrical components received in the carrier;
   each of the solder constructions having a conductive wire and a solder component adjacent the conductive wire, such that upon reflow of the solder constructions, the at least one contact of the first electrical component is electrically connected to the at least one contact of the second electrical component,
   wherein the first electrical component has a plurality of contacts lying in a first plane; and
   wherein the second electrical component has a plurality of contacts lying in a second plane perpendicular to the first plane;
   each of the solder constructions having a first contact area positioned to engage respective ones of the contacts lying the first plane and a second contact area positioned to engage respective ones of the contact lying in the second plane.

* * * * *